(12) United States Patent
Manthena et al.

(10) Patent No.: US 11,545,433 B2
(45) Date of Patent: Jan. 3, 2023

(54) NON-ORTHOGONAL SLOTTED VIAS FOR SEMICONDUCTOR DEVICES AND ASSOCIATED SYSTEMS AND METHODS

(71) Applicant: Micron Technology, Inc., Boise, ID (US)

(72) Inventors: Raja Kumar Varma Manthena, Boise, ID (US); Surendranath C. Eruvuru, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 64 days.

(21) Appl. No.: 17/121,645

(22) Filed: Dec. 14, 2020

(65) Prior Publication Data

US 2022/0189874 A1    Jun. 16, 2022

(51) Int. Cl.
| | |
|---|---|
| *H01L 23/528* | (2006.01) |
| *H01L 23/522* | (2006.01) |
| *H01L 23/532* | (2006.01) |
| *H01L 27/115* | (2017.01) |

(52) U.S. Cl.
CPC ...... *H01L 23/5283* (2013.01); *H01L 23/5226* (2013.01); *H01L 23/53214* (2013.01); *H01L 23/53228* (2013.01); *H01L 23/53257* (2013.01); *H01L 27/115* (2013.01)

(58) Field of Classification Search
CPC ............. H01L 23/5283; H01L 23/5226; H01L 23/53214; H01L 23/53228; H01L 23/53257; H01L 27/115
USPC ......................................... 257/770
See application file for complete search history.

(56) References Cited

U.S. PATENT DOCUMENTS 11,189,566 B2 *  11/2021  Shao ................. H01L 21/76811

* cited by examiner

*Primary Examiner* — Tu-Tu V Ho
(74) *Attorney, Agent, or Firm* — Perkins Coie LLP

(57) ABSTRACT

Semiconductor devices with slotted vias, and associated systems and methods, are disclosed herein. In one embodiment, a routing region of the semiconductor device includes a set of slotted vias arranged in a non-orthogonal array pattern. Further, patterns of metal lines associated with the set of slotted vias are drawn to align and/or overlap with the slotted vias. As a result, the metal lines may include zig-zag patterns within the routing region. Further, edges of the slotted vias may have a staircase pattern with sets of horizontal and vertical line segments such that a combination of the horizontal and vertical line segments can orient the slotted vias in a non-orthogonal direction.

20 Claims, 6 Drawing Sheets

Slotted Via  Bottom Metal  Top Metal

301

302

303

NON-ORTHOGONAL SLOTTED VIAS FOR SEMICONDUCTOR DEVICES AND ASSOCIATED SYSTEMS AND METHODS

TECHNICAL FIELD

The present technology generally relates to semiconductor devices and methods for manufacturing semiconductor devices, and more particularly relates to slotted vias for semiconductor devices.

BACKGROUND

Semiconductor devices are widely used in various electronic devices. For example, semiconductor memory devices are used to store information related to the electronic devices such as computers, wireless communication devices, cameras, digital displays, and the like. Information is stored by programing different states of a memory cell. Various types of memory devices exist, such as non-volatile memory devices (e.g., NAND Flash memory devices) and volatile memory devices (e.g., dynamic RAM (DRAM), synchronous dynamic RAM (SDRAM), etc.).

Improving memory devices, generally, may include increasing memory cell density, increasing read/write speeds or otherwise reducing operational latency, increasing reliability, increasing data retention, reducing power consumption, or reducing manufacturing costs, among other metrics. One way of reducing manufacturing costs is to improve manufacturing processes to increase the margin of successfully manufactured devices. Manufacturers can improve the manufacturing margin by implementing processes that, for example, increase the consistency or tolerance off manufacturing steps (e.g., removal or deposition of materials), improve the scale of manufacturing, reduce variability among memory cells, etc.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
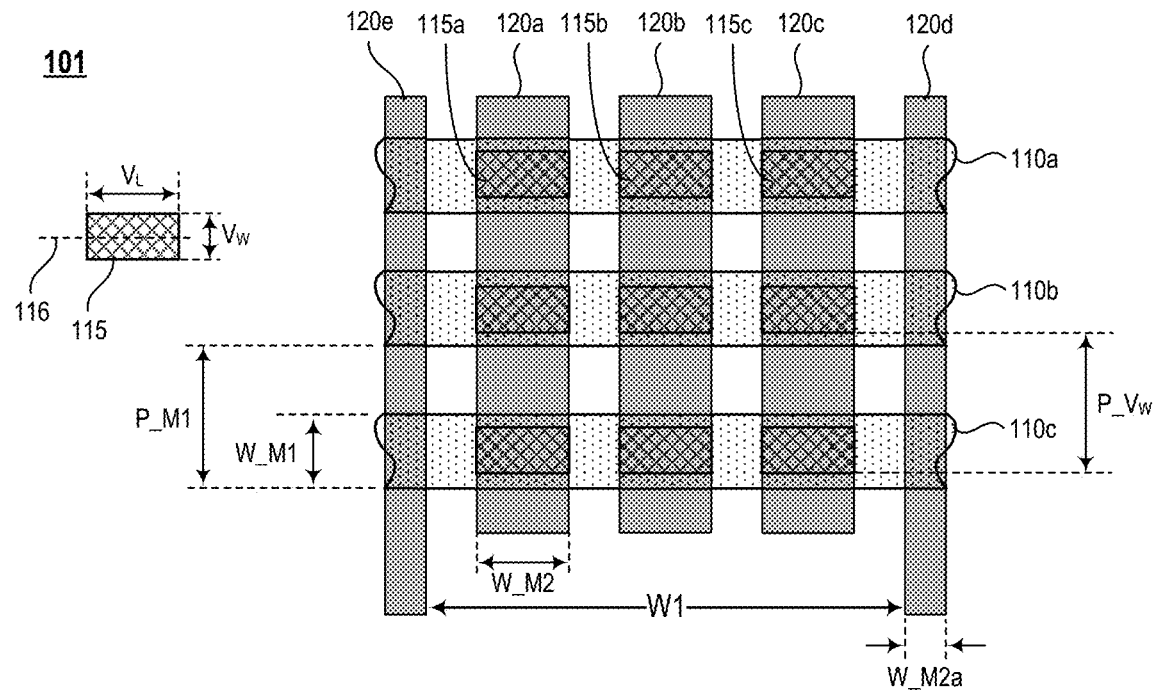
FIGS. 1A and 1B are layouts of regions of semiconductor devices.

Embodiments of the present technology include slotted vias that electrically connect a conductive trace (e.g., a first metal line) to another conductive trace (e.g., a second metal line above or below the first metal line) of semiconductor devices (e.g., 3-dimensional (3D) NAND memory devices). The slotted vias may have drawn widths different than drawn lengths. Further, the slotted vias may have primary axes aligned with either the lengths or the widths (the dimension greater than the other). The slotted vias, after completing process steps fabricating the semiconductor devices, may appear as elongated circles and/or racetrack patterns, which are filled with conductive materials. In some embodiments, the slotted vias correspond to rectangular patterns having their primary axes aligned with one of the conductive traces. For example, a length of a slotted via may be greater than a width thereof, where the length of the slotted via (i.e., the primary axis of the slotted via) extends in the same direction with one of the conductive traces (e.g., the first metal line, the second metal line).

In some embodiments, the slotted vias are organized in an orthogonal array pattern in certain regions of the semiconductor devices, where primary axes of the slotted vias align with rows (or columns) of the array pattern. Further, the rows and columns of the array pattern may align with first and second conductive traces extending in orthogonal directions, respectively. As such, the slotted vias arranged in the orthogonal array pattern may allow scaling of areas occupied by one of the conductive traces (e.g., the first metal lines)—e.g., pitches of the first metal lines can be reduced to match pitches of the widths of the slotted vias. Pitches of the second metal lines covering the slotted vias in the other direction, however, may be significantly greater than the first metal lines (at least partially due to the lengths of slotted vias being greater than the widths), which in turn limit scaling of a total area of the region occupied by the slotted vias that couple the first metal lines to the second metal lines.

In some embodiments, the slotted vias can be arranged in a non-orthogonal array pattern, where individual slotted vias are rotated by a non-zero angle—e.g., primary axes of the slotted bias rotated by 45-degrees when compared to those in the orthogonal array pattern. As such, the primary axes of the slotted vias do not align with columns (or rows) of the array pattern. In this manner, the total area of the region occupied by the slotted vias may be scaled (reduced) because neither the first metal lines nor the second metal lines are required to cover the slotted vias in the direction orthogonal to the primary axes of the slotted vias (e.g., the lengths of the slotted vias). Further, patterns of the first and second metal lines may not be straight within the regions such that the first and second metal lines align with the slotted vias arranged in the non-orthogonal array pattern. As a result, in some embodiments, each of the first and second metal lines include zig-zag patterns within the region.

Moreover, as described more in more detail herein, the slotted vias arranged in the non-orthogonal array pattern can mitigate risks associated with routing signals in a predetermined space in the semiconductor device by placing a certain quantity of slotted vias in the space—e.g., a space between metal lines carrying electrical signal unrelated to the slotted vias (and the first and second metal lines coupled to each other through the slotted vias). Additionally, or alternatively, the slotted vias arranged in the non-orthogonal array pattern may allow placing a greater quantity of slotted vias in such a predetermined space.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A through 5. For example, some details of semiconductor devices well known in the art have been omitted so as not to obscure the present technology. In general, it should be understood that various other devices and systems in addition to those specific embodiments disclosed herein may be within the scope of the present technology.

As used herein, the terms "vertical/horizontal," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A through 5.

FIG. 1A is a layout 101 of a region of a semiconductor device (e.g., a 3D NAND memory device). The layout 101 illustrates bottom metal lines 110 (also identified individually as 110a-c) and top metal lines 120 (also identified individually as 120a-e). Further, the layout 101 illustrates slotted vias 115 (also identified individually as 115a-c) at locations where individual bottom metal lines 110 overlap (e.g., topologically intersect) with individual top metal lines 120. The layout 101 may represent a region of the semiconductor device where various signals are routed between metal lines located in different dielectric layers (e.g., interconnect layers) through the slotted vias 115—e.g., a routing region of the semiconductor device. One of the slotted vias 115 is depicted separately in FIG. 1A to describe various features of the slotted vias 115, for example, a primary axis 116, a width $V_W$, and a length $V_L$. As depicted in FIG. 1A, the length $V_L$ may be greater than the width $V_W$. Each slotted via couples one of the bottom metal lines 110 to corresponding one of the top metal lines 120. For example, the slotted via 115a couples the bottom metal line 110a to the top metal line 120a, and the slotted via 115c couples the bottom metal line 110a to the top metal line 120c, or the like. The slotted vias 115 in the layout 101 may be regarded as arranged in an orthogonal array pattern, where primary axes of individual slotted vias 115 align with rows of the array pattern, which in turn align with the bottom metal lines 110.

The layout 101 illustrates that a width (W_M1) of the bottom metal lines 110 are less than a width (W_M2) of the top metal lines 120, at least partially due to the width $V_W$ being less than the length $V_L$ of the slotted vias 115. Additionally, pitches (P_M1) of the bottom metal lines 110 match pitches (P_$V_W$) of the slotted vias 115. Further, the width of the bottom metal lines 110 includes a margin (i.e., the width W_M1 less the width $V_W$, which may also be referred to as an endcap) against statistical process variations—e.g., misregistration between the bottom metal lines 110 and the slotted vias 115, variations in critical dimensions associated with patterning the bottom metal lines 110 and the slotted vias 115, respectively.

The width of the top metal lines 120 (e.g., W_M2) may be greater than the bottom metal lines 110 (e.g., W_M1) even though the top metal lines 120 may not be required to include the same margin as the bottom metal lines 110. The width of the top metal lines 120 is greater than the bottom metal lines 110 at least partially due to the length $V_L$ being greater than the width $V_W$ of the slotted vias 115. Further, the width of the top metal lines 120 (e.g., W_M2) in the routing region may be significantly greater than the top metal lines 120 that are not coupled to the slotted vias 115—e.g., a width W_M2a of a top metal line 120d. As such, scaling of the width (W1) of the routing region may be difficult to achieve in view of the slotted vias 115 arranged in the orthogonal array pattern and corresponding widths of the top metal lines 120 in the routing region.

Figure 1B:
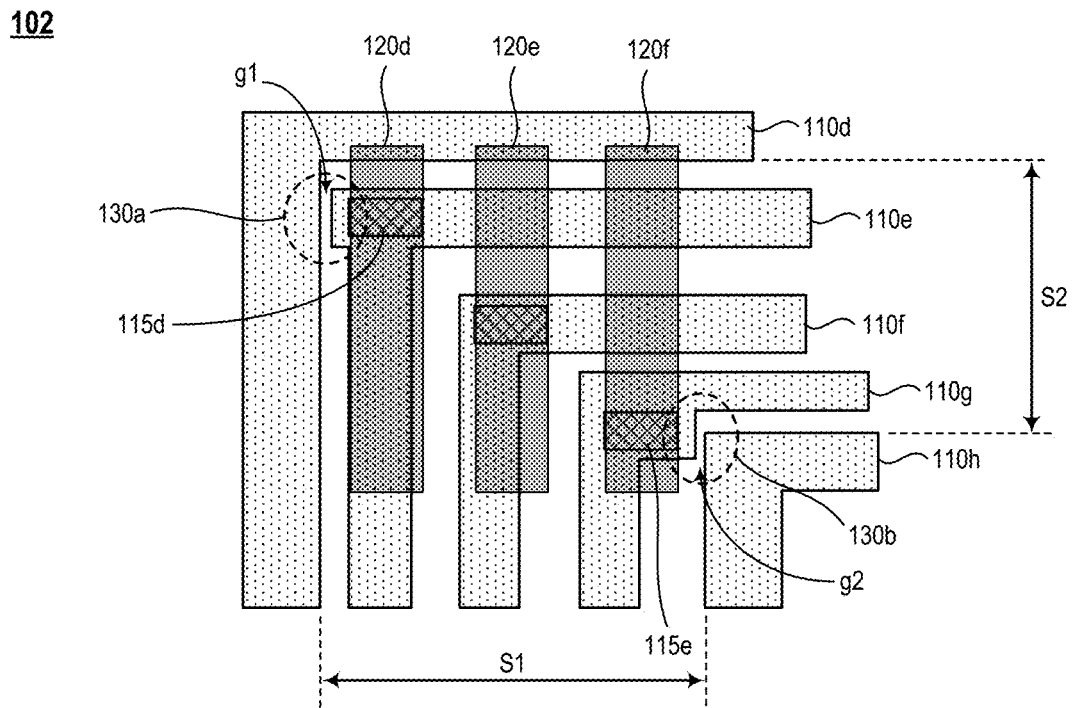

FIG. 1B is a layout 102 of another region of the semiconductor device. The layout 102 illustrates bottom metal lines 110 (also identified individually as 110d-h) and top metal lines 120 (also identified individually as 120d-f). Further, the layout 102 illustrates slotted vias 115 (also identified individually as 115d/e). Each slotted via 115 couples one of the bottom metal lines 110 to corresponding one of the top metal lines 120—e.g., the bottom metal line 110e coupled to the top metal line 120d through the slotted via 115d. In some embodiments, the layout 102 may be a region of the semiconductor device where an area is fixed between the bottom metal lines 110d and 110h (e.g., the area between the bottom metal lines 110d and 110h as confined by spacings S1 and S2). Further, at least three slotted vias 115 may need to be placed in the area as shown in FIG. 1B—e.g., to route signals between the bottom metal lines 110e-g and the top metal lines 120d-f, respectively.

As described above, the bottom metal lines 110e-g may need to include the margins (e.g., the endcaps) for the slotted vias 115, which in turn result in risky areas 130 (also identified individually as 130a/b). For example, the risky area 130a illustrates a gap (g1) between the bottom metal lines 110d and 110e, which could be less than a design rule specifying a minimum space allowed for the bottom metal lines. In view of the statistical process variations, the gap in the risky area 130a may cause the bottom metal lines 110d and 110e connected to each other (e.g., electrically shorted) rendering the semiconductor device non-functional. Similarly, the gap (g2) in the risky area 130b may result in the bottom metal lines 110g and 110h connected to each other (e.g., electrically shorted). In some embodiments, the spacings S1 and/or S2 may need to be increased to avoid such a risk, which in turn may increase the footprint of the semiconductor device. In other embodiments, a less quantity of slotted vias 115 (e.g., two (2) instead of three (3) slotted vias 115) may be placed in the area between the bottom metal lines 110d and 110h, which in turn may result in an inefficient routing of the signals.

Figure 2A:
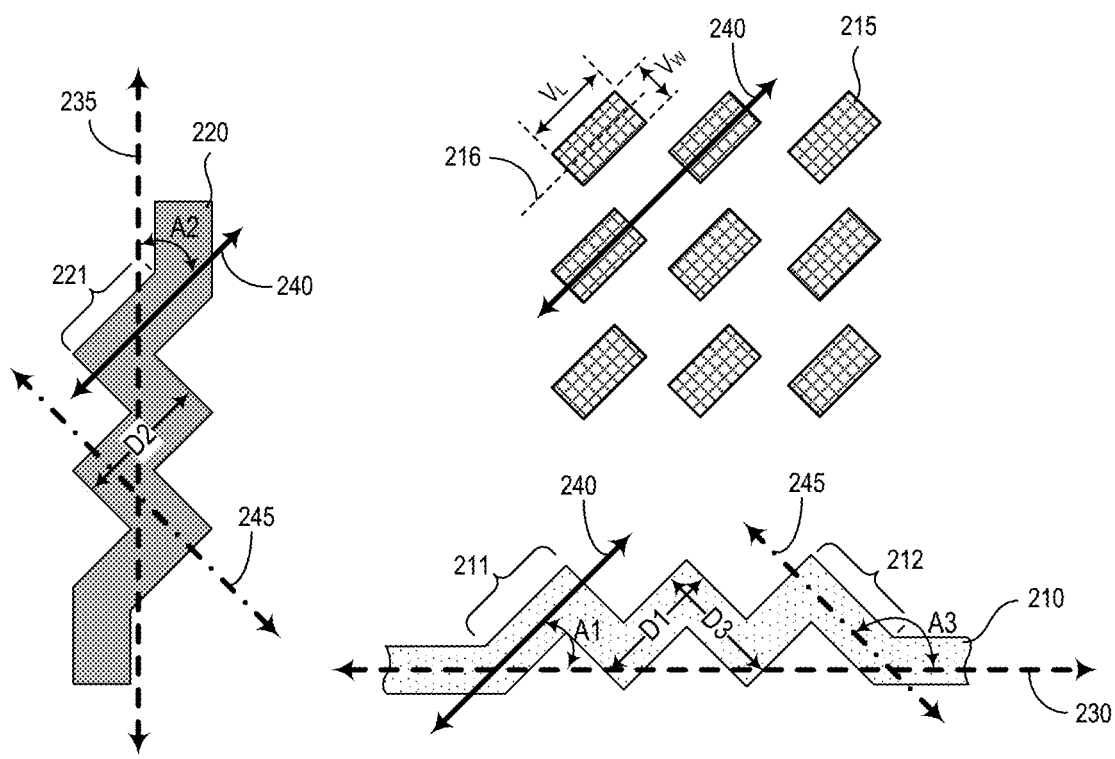
FIGS. 2A and 2B are layouts of regions of semiconductor devices in accordance with embodiments of the present technology.

FIG. 2A is a layout 201 of a region of a semiconductor device (e.g., a 3D NAND memory device) in accordance with embodiments of the present technology. The layout 201 illustrates first conductive traces 210 (also identified individually as 210a-c) and second conductive traces 220 (also identified individually as 220a-e). Further, the layout 201 illustrates slotted vias 215 (also identified individually as 215a-c) at locations where individual first conductive traces 210 overlap with individual second conductive traces 220.

The first and second conductive traces 210 and 220 may include aspects of the bottom and top metal lines 110 and 120, respectively. Further, the slotted vias 215 may be examples of or include aspects of the slotted vias 115—e.g., the slotted vias 215 having primary axes 216, the width $V_W$, and the length $V_L$. FIG. 2A also illustrates layouts of one of the first conductive traces 210, one of the second conductive traces 220, and the array of slotted vias 215 separately in order to describe various features associated with the first and second conductive traces 210 and 220, and the slotted vias 215 without obfuscation stemming from overlapping patterns of the layout 201.

The first conductive traces 210 and the second conductive traces 220 may be located in different layers (e.g., dielectric layers, interconnect layers) of the semiconductor device. For example, the first conductive traces 210 are located in a first dielectric layer, and the second conductive traces 220 are located in a second dielectric layer above (or below) the first layer. Further, individual slotted vias 215 extend from the first dielectric layer to the second dielectric layer such that each one of the slotted vias 215 conductively couples one of the first conductive traces 210 to corresponding one of the second conductive traces 220. For example, the slotted via 215a couples the first conductive trace 210a to the second conductive trace 220a, or the like. As such, the layout 201 may represent a region of the semiconductor device where various signals are routed between conductive traces located in different interconnect layers (e.g., metal lines located in different dielectric layers) through the slotted vias 215—e.g., a routing region of the semiconductor device. In some embodiments, the first and second conductive traces include at least one of tungsten (W), copper (Cu), or aluminum (Al). In some embodiments, the slotted vias include Cu or W.

In comparison to the slotted vias 115 in the layout 101 described with reference to FIG. 1A, the slotted vias 215 in the layout 201 may be regarded as arranged in a non-orthogonal array pattern, where primary axes 216 of individual slotted vias 215 do not align with rows (or columns) of the non-orthogonal array pattern. Further, the first conductive traces 210 and the second conductive traces 220 include zig-zag patterns to align and/or overlap with the slotted vias 215 arranged in the non-orthogonal array pattern. Neither the first conductive traces 210 nor the second conductive traces 220 in the routing region of the layout 201 are as wide as the top metal lines 120 covering the slotted vias 115 of the layout 101 (e.g., the top metal lines 120a-c), at least partially due to the orientation of the slotted vias 215. In other words, neither the first conductive traces 210 nor the second conductive traces 220 are wide to cover the entire length $V_L$ of the slotted vias 215 in an orthogonal direction with respect to the primary axes 216. As such, the width of the second conductive traces 220 can be reduced from the width (W_M2) of the top metal lines 120a-c of the layout 101. Accordingly, the width W2 of the routing region of the layout 201 can be less than the width W1 of the routing region of the layout 101.

In some embodiments, the semiconductor device includes first conductive traces 210 that each extends in a first direction 230—e.g., entering and exiting the routing region of the layout 201 along the first direction 230. Each individual first conductive traces 210 includes one or more first elongated segments 211 oriented in a third direction 240 rotated from the first direction 230 by a first non-zero angle (denoted as A1). Further, each individual first conductive traces 210 includes one or more third elongated segments 212 oriented in a fourth direction 245 rotated from the first direction 230 by a third non-zero angle (denoted as A3). The first and third non-zero angles (e.g., A1 and A3) may form supplementary angles. Each of the first elongated segments 211 may have a first length (denoted as D1), and each of the third elongated segments 212 may have a third length (denoted as D3). In some embodiments, the first length (D1) is equal to the third length (D3)—i.e., A1 corresponding to 45-degrees, and A3 corresponding to 135-degrees.

As such, each individual first conductive traces 210 may include a zig-zag pattern within the routing region of the layout 201, where the zig-zag pattern has at least one of the first elongated segments 211 conjoined with at least one of the third elongated segments 212. In other words, each one of the first conductive traces 210 may be regarded to include at least two turns (rotations) in the routing region—e.g., a first turn from the first direction 230 to form the first elongated segment 211 along the third direction 240 (or the third elongated segments 212 in the fourth direction 245), followed by a second turn from the third direction 240 to follow the fourth direction 245 (or from the fourth direction 245 to follow the third direction 240). In some embodiments, however, each one of the first conductive traces 210 may include one first elongated segment 211, absent the third elongated segment 212 if the first conductive trace 210 were associated with one slotted via 215. In other words, the first conductive trace 210 may include one turn (rotation) in the routing region—e.g., a first turn from the first direction 230 to form the first elongated segment 211, without forming the third elongated segments 212. In such embodiments, the first conductive trace 210 may include portions outside the routing region that are not aligned to each other—e.g., similar to the second conductive traces 220 described with reference to FIG. 2B, if rotated by 90-degrees.

Moreover, the semiconductor device includes second conductive traces 220 that each extends in a second direction 235—e.g., entering and exiting the routing region of the layout 201 along the second direction 235. Each individual second conductive traces 220 includes one or more second elongated segments 221 oriented in the third direction 240 rotated from the second direction 235 by a second non-zero angle (denoted as A2). In this manner, individual second elongated segments 221 can align and/or overlap with corresponding first elongated segments 211 of the first conductive traces 210. Each of the second elongated segments 221 may have a second length (denoted as D2). In some embodiments, the second length (D2) of the second elongated segments 221 is equal to the first length (D1) of the first elongated segments 211 of the first conductive traces 210.

Similar to the first conductive traces 210, each individual second conductive traces 220 may include a zig-zag pattern within the routing region of the layout 201, where the zig-zag pattern has at least two turns (rotations) in the routing region—e.g., a first turn from the second direction 235 to form the second elongated segments 221 along the third direction 240, followed by a second turn from the third direction 240. In some embodiments, however, each one of the second conductive traces 220 may include one second elongated segment 221 if the second conductive trace 220 were associated with one slotted via 215. In other words, the second conductive trace 220 may include one turn (rotation) in the routing region—e.g., a first turn from the second direction 235 to form the second elongated segment 221, which would be similar to the second conductive traces 220 described with reference to FIG. 2B.

Further, the semiconductor device includes a plurality of slotted vias 215 in the routing region of the layout 201. Individual slotted vias 215 have primary axes 216 oriented in the third direction 240 such that each one of the slotted vias 215 aligns and/or overlaps with corresponding one of the first elongated segments 211 of the first conductive traces 210 (and the second elongated segments 221 of the second conductive traces 220). Each one of the slotted vias 215 has a footprint that is completely within a corresponding one of the first elongated segments 211 of the first conductive traces 210. In other words, the first elongated segments 211 of the first conductive traces 210 may include a margin (an endcap) that ensures the footprints of the slotted vias 215 entirely landing on the first elongated segments 211 as described herein—e.g., despite the statistical process variations. In some embodiments, at least one of the slotted vias 215 is partially uncovered by a footprint of the second elongated segments 221. In other words, at least certain portions of top surfaces of the slotted vias 215 may be exposed—e.g., uncovered by the second elongated segments 221.

Moreover, each one of the slotted vias 215 is configured to carry electrical signals between one of the first elongated segments 211 of the first conductive traces 210 and one of the second elongated segments 221 of the second conductive traces 220. In some embodiments, each one of the slotted vias 215 has a width ($V_W$) corresponding to a minimum feature size of the semiconductor device, where the width ($V_W$) is orthogonal to the primary axes 216 of the slotted vias 215 as depicted in FIG. 2A.

Figure 2B:
Figure 2B:
Figure 2B:
Figure 2B:
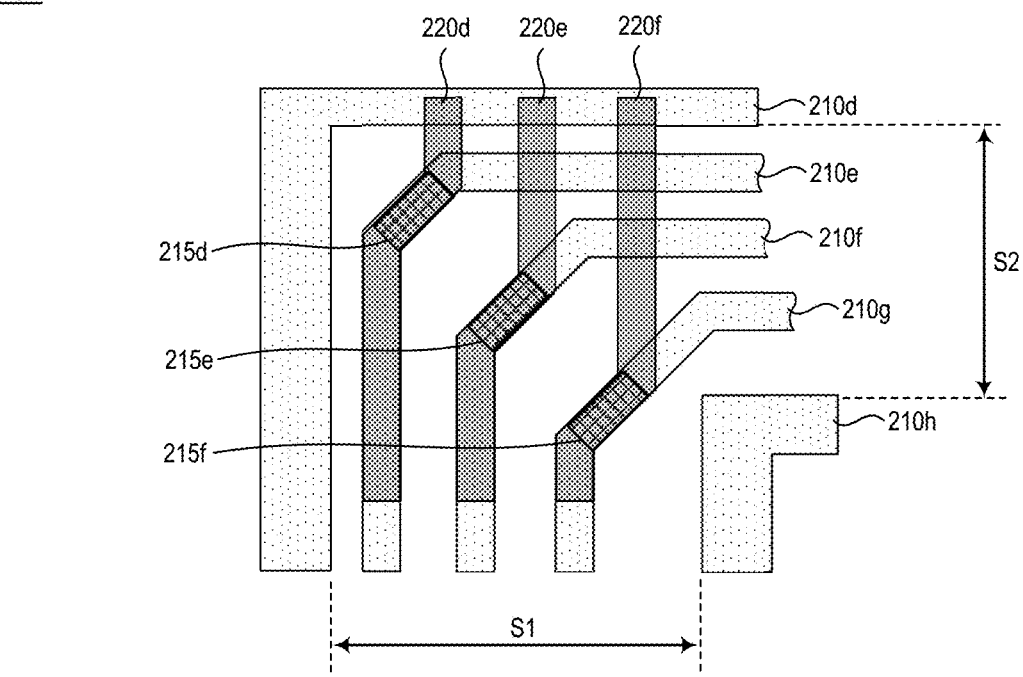
Figure 2B:
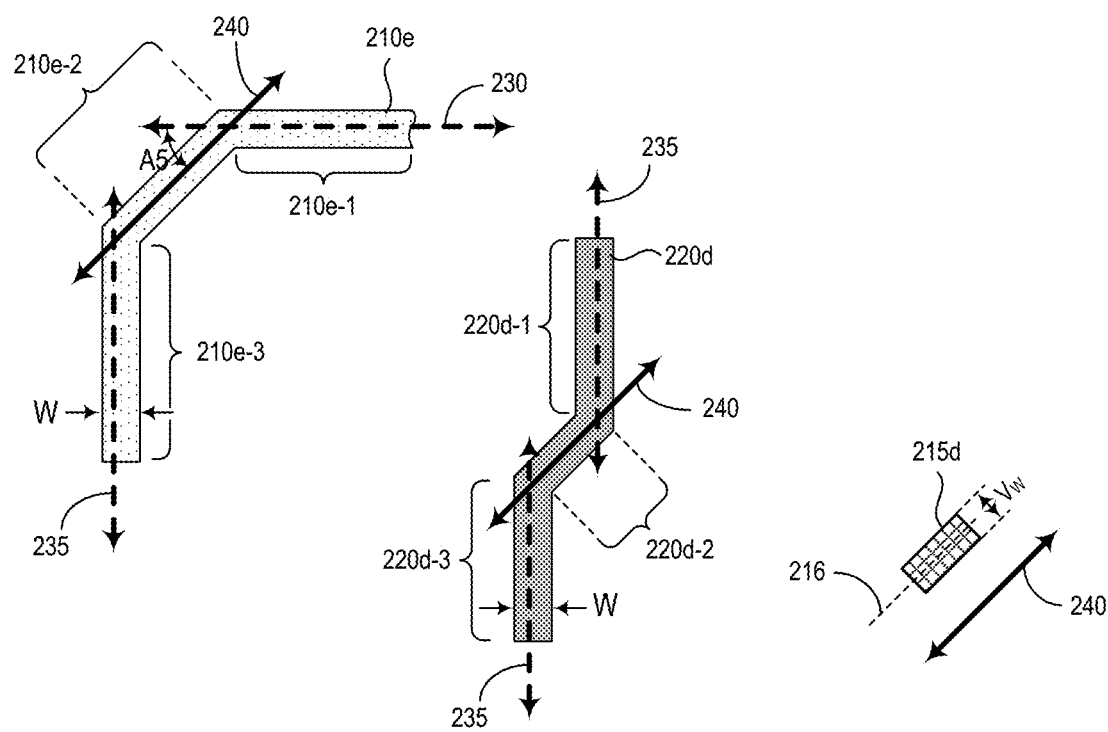

FIG. 2B is a layout 202 of another region of the semiconductor device in accordance with embodiments of the present technology. The layout 202 illustrates first conductive traces 210 (also identified individually as 210d-h) and second conductive traces 220 (also identified individually as 220d-f). Further, the layout 202 illustrates slotted vias 215 (also identified individually as 215d-f). Each one of the slotted vias 215 couples one of the first conductive traces 210 to corresponding one of the second conductive traces 220—e.g., the slotted via 215d coupling the first conductive trace 210e to the second conductive trace 220d. In some embodiments, the layout 202 may be a region of the semiconductor device where an area is fixed between the first conductive traces 210d and 210h (e.g., the area between the first conductive traces 210d and 210h as confined by spacings S1 and S2), similar to the layout 102 of FIG. 1B. Also illustrated in FIG. 2B are layouts of an individual first conductive trace 210, an individual second conductive trace 220, and a slotted via 215 separately in order to describe various features associated with the first and second conductive traces 210 and 220, and the slotted vias 215 without obfuscation stemming from overlapping patterns of the layout 202.

In comparison to the slotted vias 115 in the layout 102 described with reference to FIG. 1B, the slotted vias 215 in the layout 202 are arranged in a non-orthogonal orientation—e.g., the primary axes of the slotted vias 215 do not align with the first conductive traces 210 along the first direction 230 or the second conductive traces 220 along the second direction 235 outside of the area. Such a non-orthogonal orientation of the slotted vias 215 provides room between adjacent conductive traces—e.g., between two neighboring first conductive traces 210, such as 210d/e and 210g/h. As a result, the space between two neighboring first conductive traces 210 can satisfy a minimum space design rules for the semiconductor device. For example, the gap (g1) of the risk area 130a in the layout 102 is removed by placing the slotted via 215d in a non-orthogonal direction. Similarly, the gap (g2) of the risk area 130b in the layout 102 is removed by placing the slotted via 215f in the non-orthogonal direction. Further, the first conductive traces 210 (e.g., the first conductive traces 210e-g) and the second conductive traces 220 include one or more turns to align and/or overlap with the slotted vias 215 oriented in the non-orthogonal direction, respectively.

In some embodiments, the semiconductor device includes a first conductive trace (e.g., the first conductive traces 210e) including a first elongated segment (e.g., segment 210e-1) extending in a first direction 230, a second elongated segment (e.g., segment 210e-2) extending in a second direction 240 rotated from the first direction 230 (e.g., by a non-zero angle (denoted as A5)), and a third elongated segment (e.g., segment 210e-3) extending in a third direction 235 orthogonal to the first direction 230. Further, the second elongated segment (e.g., segment 210e-2) has a first end connected to the first elongated segment (e.g., segment 210e-1) and a second end opposite to the first end connected to the third elongated segment (e.g., segment 210e-3).

Moreover, the semiconductor device includes a second conductive trace (e.g., the second conductive trace 220d), where the second conductive trace includes a first elongated segment (e.g., segment 220d-1) extending in the third direction 235, a second elongated segment (e.g., segment 220d-2) extending in the second direction 240, and a third elongated segment (e.g., segment 220d-3) extending in the third direction 235. The second elongated segment (e.g., segment 220d-2) has a first end connected to the first elongated segment (e.g., segment 220d-1) and a second end opposite to the first end connected to the third elongated segment (e.g., segment 220d-3).

The semiconductor device further includes a slotted via (e.g., slotted via 215d) with its primary axis 216 oriented in the second direction 240 such that the slotted via 215d can align and/or overlap with the second elongated segment (e.g., segment 210e-2) of the first conductive trace (e.g., the first conductive trace 210e) and the second elongated segments (e.g., segment 220d-2) of the second conductive trace (e.g., the second conductive trace 220d). The slotted via 215d may have a width ($V_W$) that corresponds to a minimum feature size of the semiconductor device. The width ($V_W$) is orthogonal to the primary axis 216 of the slotted via 215.

In some embodiments, the first conductive trace (e.g., the first conductive trace 210e) is located in a first dielectric layer of the semiconductor device. Additionally, the semiconductor device includes a third conductive trace (e.g., one of the first conductive trace, namely 210d) located in the first dielectric layer. The third conductive trace includes a first elongated segment extending in the first direction 230 and a second elongated segment extending in the third direction 235, the first elongated segment connected to the second elongated segment forming a right-angled corner located proximate to the second elongated segment (e.g., the segment 210e-2) of the first conductive trace (e.g., the first conductive trace 210e). Further, the first conductive trace is spaced apart from the third conductive trace such that a minimum distance between the first and third conductive traces satisfies a minimum space design rule for the first layer.

Figure 3:
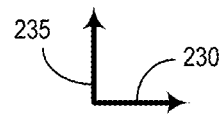
FIG. 3 illustrates slotted vias in accordance with embodiments of the present technology.
Figure 3:
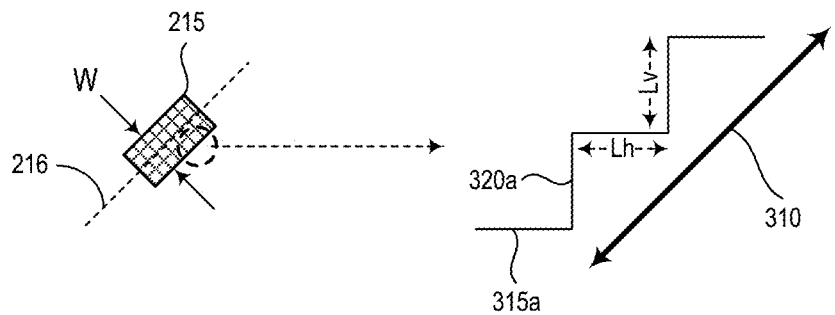
Figure 3:
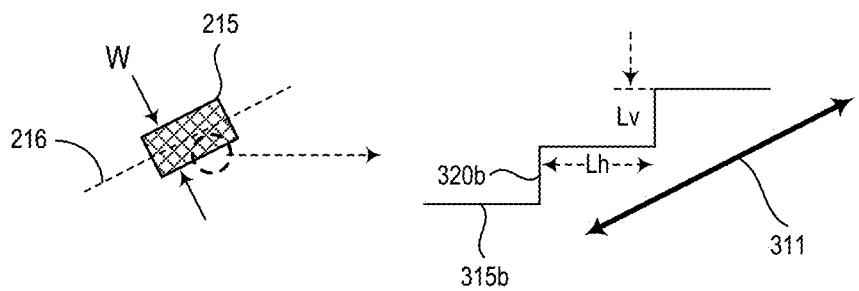
Figure 3:
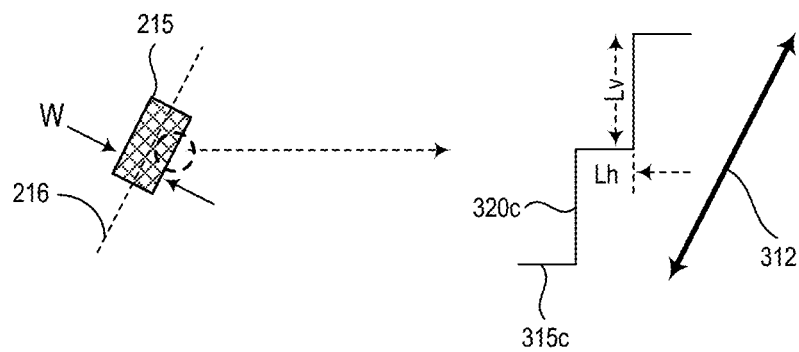

FIG. 3 illustrates layouts 301-303 of slotted vias 215 in accordance with embodiments of the present technology. The layouts 301-303 depict further details of slotted vias 215 arranged in three different non-orthogonal directions. That is, the primary axes 216 of the slotted vias 215 are not aligned to either a horizontal direction (e.g., the first direction 230) or a vertical direction (e.g., the second direction 235). In some embodiments, edges of such slotted vias 215 have a staircase pattern including a set of first line segments (one of which, for each layouts 301-303, is individually identified as 315a-c, respectively) and a set of second line segments (one of which, for each layouts 301-303, is individually identified as 320a-c, respectively), where individual first line segments extend in the first direction 230 (e.g., a horizontal direction) and individual second line segments extend in the second direction 235 (e.g., a vertical direction). Further, the individual first line segments have a first length (Lh), and the individual second line segments have a second length (Lv), which, in combination, orient the slotted vias in a non-orthogonal direction. For example, directions 310, 311, and 312 are aligned to neither the horizontal direction (e.g., the first direction 230) nor a vertical direction (e.g., the second direction 235).

The layout 301 illustrates that the first length (Lh) may be equal to the second length (Lv), and the combination of the first and second lengths orients the major axis 216 of the slotted via 215 in a non-orthogonal direction 310 that is rotated (anti-clockwise) by 45-degrees from the first direction 230. The layout 302 illustrates that the first length (Lh) may be greater than the second length (Lv), and such a combination of the first and second lengths orients the major axis 216 of the slotted via 215 in another non-orthogonal direction 311 that is rotated (anti-clockwise) by an angle less than 45-degrees from the first direction 230. The layout 303 illustrates that the first length (Lh) may be less than the second length (Lv), and such a combination of the first and second lengths orients the major axis 216 of the slotted via 215 in yet another non-orthogonal direction 312 that is rotated (anti-clockwise) by an angle greater than 45-degrees from the first direction 230.

Further, in some embodiments, the elongated segments of the first and/or second conductive traces oriented in non-orthogonal directions include such configurations including staircase patterns—e.g., the first elongated segments 211, third elongated segments 212, second elongated segments 221, etc. In other words, the elongated segments of the first and/or second conductive traces that are oriented in non-orthogonal directions may include a set of first line segments extending in a first direction and a set of second line segments extending in a second direction.

Figure 4:
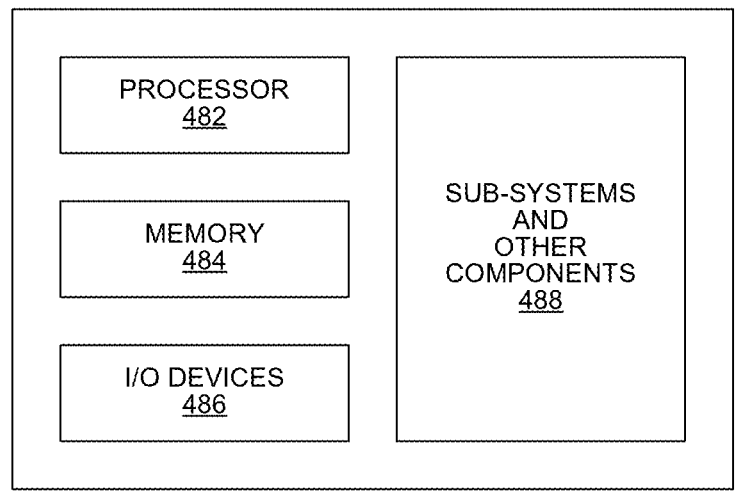
FIG. 4 is a schematic view of a system that includes a memory device including slotted vias in accordance with embodiments of the present technology.

The semiconductor device described in detail above with reference to FIGS. 2A through 3 or packages incorporating such a semiconductor device (e.g., a memory device) can be incorporated into any of a myriad of larger and/or more complex systems, a representative example of which is a system 480 shown schematically in FIG. 4. The system 480 can include a processor 482, a memory 484 (e.g., SRAM, DRAM, flash, 3D NAND memory and/or other memory devices), input/output devices 486, and/or other subsystems or components 488. For example, the memory 484 may include 3D NAND memory devices with slotted vias arranged in non-orthogonal directions described with reference to FIG. 2A through 3. As such, the memory devices of the memory 484 can include routing regions having slotted vias organized in the non-orthogonal array pattern and conductive traces with zig-zag patterns to align and/or overlap with the slotted vias. The memory devices and/or packages incorporating such memory devices can be included in any of the elements shown in FIG. 4.

The resulting system 480 can be configured to perform any of a wide variety of suitable computing, processing, storage, sensing, imaging, and/or other functions. Accordingly, representative examples of the system 480 include, without limitation, computers and/or other data processors, such as desktop computers, laptop computers, internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 480 include lights, cameras, vehicles, etc. With regard to these and other example, the system 480 can be housed in a single unit or distributed over multiple interconnected units, for example, through a communication network. The components of the system 480 can accordingly include local and/or remote memory storage devices and any of a wide variety of suitable computer-readable media.

Figure 5:
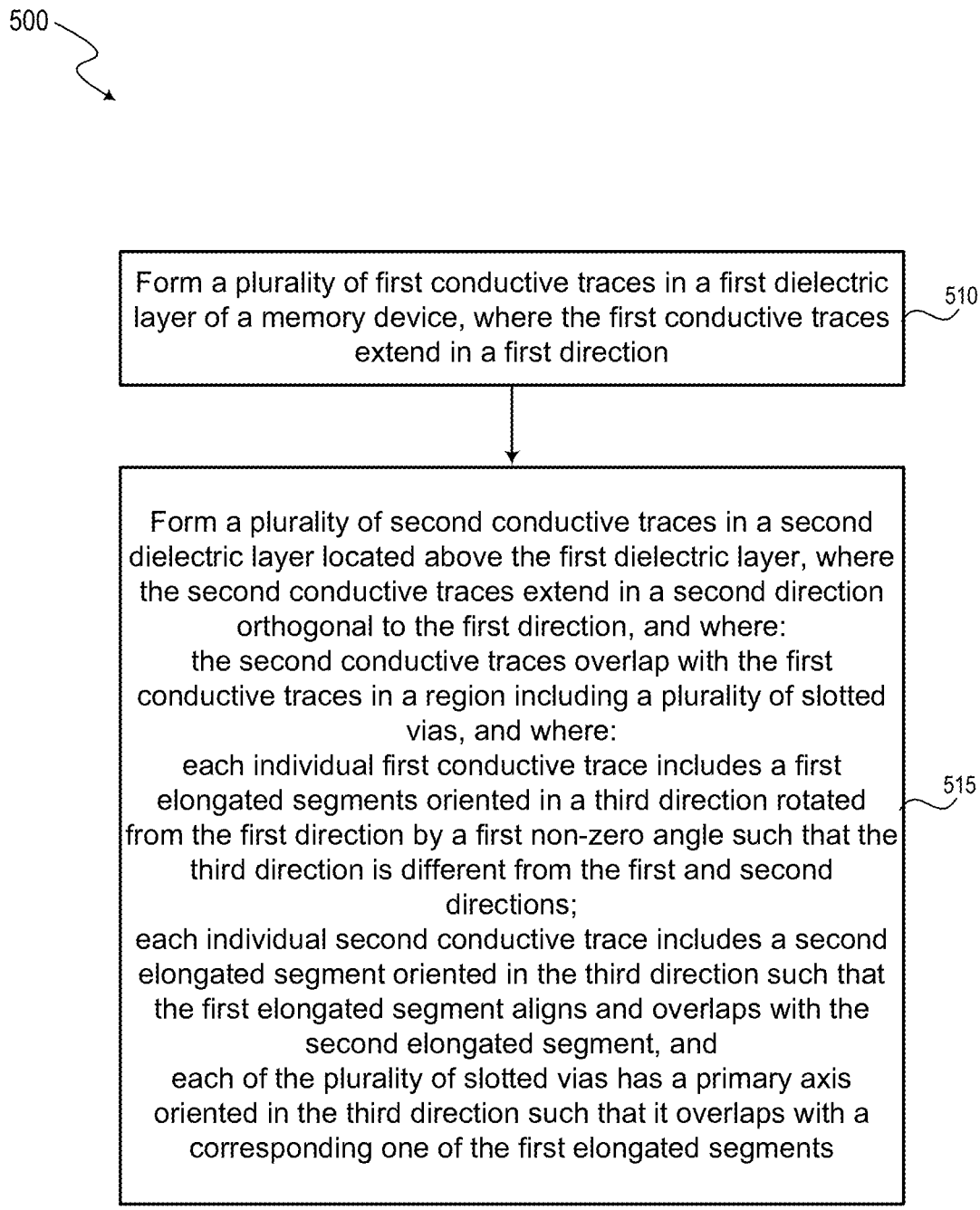
FIG. 5 is a flowchart of a method for forming a semiconductor device including slotted vias in accordance with embodiments of the present technology.

FIG. 5 is a flowchart 500 of a method forming a semiconductor device including slotted vias in accordance with embodiments of the present technology. The flowchart 500 may include aspects of methods as described with reference to FIGS. 2A through 3.

The method includes forming a plurality of first conductive traces in a first dielectric layer of the memory device, where the first conductive traces extend in a first direction (box 510). The method further includes forming a plurality of second conductive traces in a second dielectric layer located above the first dielectric layer, where the second conductive traces extend in a second direction orthogonal to the first direction, and where the second conductive traces overlap with the first conductive traces in a region including a plurality of slotted vias, where each individual first conductive trace includes a first elongated segments oriented in a third direction rotated from the first direction by a first non-zero angle such that the third direction is different from the first and second directions, each individual second conductive trace includes a second elongated segment oriented in the third direction such that the first elongated segment aligns and overlaps with the second elongated segment, and each of the plurality of slotted vias has a primary axis oriented in the third direction such that it overlaps with a corresponding one of the first elongated segments (box 515).

It should be noted that the methods described above describe possible implementations, and that the operations and the steps may be rearranged or otherwise modified and that other implementations are possible. Furthermore, embodiments from two or more of the methods may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

Although in the foregoing example embodiments, semiconductor devices including 3D NAND memory have been described and illustrated, in other embodiments, semiconductor devices may include different types of memory—e.g., DRAM, 3D cross-point memory, resistive memory, magnetic memory, ferroelectric memory, etc. Moreover, the present technology of forming slotted vias in non-orthogonal directions and conductive traces including zig-zag patterns accordingly may be applied to semiconductor devices other than memory devices (e.g., processors, controllers, etc.) to reduce areas of routing regions and/or to provide margins against statistical process variations.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device, comprising:
a plurality of first conductive traces that each extends in a first direction;
a plurality of second conductive traces that each extends in a second direction orthogonal to the first direction; and
a plurality of slotted vias in a region, within which the second conductive traces overlap with the first conductive traces, wherein:
each individual first conductive trace includes a first elongated segment oriented in a third direction rotated from the first direction by a first non-zero angle such that the third direction is different from the first and second directions;
each individual second conductive trace includes a second elongated segment oriented in the third direction such that the first elongated segment aligns and overlaps with the second elongated segment; and
each of the plurality of slotted vias has a primary axis oriented in the third direction such that it overlaps with a corresponding one of the first elongated segments.

2. The semiconductor device of claim 1, wherein each individual first conductive trace further includes a third elongated segment oriented in a fourth direction rotated from the first direction by a third non-zero angle such that the fourth direction is different from the first, second, and third directions.

3. The semiconductor device of claim 2, wherein the third elongated segment is connected to the first elongated segment.

4. The semiconductor device of claim 2, wherein:
the first elongated segment has a first length; and
the third elongated segment has a second length equal to the first length.

5. The semiconductor device of claim 2, wherein each individual first conductive trace includes a zig-zag pattern within the region, the zig-zag pattern having the first elongated segment conjoined with the third elongated segment.

6. The semiconductor device of claim 1, wherein:
the first conductive traces are located in a first dielectric layer of the semiconductor device;
the second conductive traces located in a second dielectric layer of the semiconductor device, the second layer located above the first layer; and
individual slotted vias extend from the first layer to the second layer such that each one of the slotted vias conductively couples each one of the first elongated segments to corresponding one of the second elongated segments.

7. The semiconductor device of claim 6, wherein each one of the slotted vias has a footprint that is completely within a corresponding one of the first elongated segments of the first conductive traces.

8. The semiconductor device of claim 6, wherein at least one of the slotted vias is partially uncovered by a footprint of the second elongated segments.

9. The semiconductor device of claim 1, wherein each one of the slotted vias is configured to carry electrical signals between one of the first elongated segments and one of the second elongated segments.

10. The semiconductor device of claim 1, wherein each one of the slotted vias has a width corresponding to a minimum feature size of the semiconductor device, the width being orthogonal to the primary axis of the slotted vias.

11. The semiconductor device of claim 1, wherein the first and second conductive traces include at least one of tungsten (W), copper (Cu), or aluminum (Al), and wherein the slotted vias include Cu or W.

12. The semiconductor device of claim 1, wherein an edge of individual slotted vias has a staircase pattern including a plurality of first line segments and a plurality of second line segments, wherein individual first line segments extend in the first direction and individual second line segments extend in the second direction.

13. The semiconductor device of claim 12, wherein:
the individual first line segments have a first length;
the individual second line segments have a second length; and
the first and second lengths, in combination, orient the slotted vias in the third direction.

14. The semiconductor device of claim 13, wherein the first length is equal to the second length.

15. A semiconductor device, comprising:
a first conductive trace including a first elongated segment extending in a first direction, a second elongated segment extending in a second direction rotated from the first direction by a non-zero angle, and a third elongated segment extending in a third direction orthogonal to the first direction, wherein the second direction is different from the first and third directions, and the second elongated segment has a first end connected to the first elongated segment and a second end opposite to the first end connected to the third elongated segment;
a second conductive trace including a first elongated segment extending in the third direction, a second elongated segment extending in the second direction, and a third elongated segment extending in the third direction, wherein the second elongated segment has a first end connected to the first elongated segment and a second end opposite to the first end connected to the third elongated segment; and
a slotted via having a primary axis oriented in the second direction, wherein the slotted via overlaps with the second elongated segment of the first conductive trace and the second elongated segment of the second conductive trace.

16. The semiconductor device of claim 15, wherein:
the first conductive trace is located in a first dielectric layer of the semiconductor device;
the second conductive trace is located in a second dielectric layer of the semiconductor device, the second layer located above the first layer; and
the slotted via extends from the first layer to the second layer such that the slotted via conductively couples the second elongated segment of the first conductive trace to the second elongated segment of the second conductive trace.

17. The semiconductor device of claim 15, wherein the slotted via has a width corresponding to a minimum feature size of the semiconductor device, the width being orthogonal to the primary axis of the slotted via.

18. The semiconductor device of claim 15, wherein the first conductive trace is located in a first dielectric layer of the semiconductor device, the semiconductor device further comprising:
a third conductive trace located in the first dielectric layer, the third conductive trace including a first elongated segment extending in the first direction and a second elongated segment extending in the third direction, the first elongated segment connected to the second elongated segment forming a right-angled corner located proximate to the second elongated segment of the first conductive trace.

19. The semiconductor device of claim 18, wherein the first conductive trace is spaced apart from the third conductive trace such that a minimum distance between the first and third conductive traces satisfies a minimum space design rule for the first dielectric layer.

20. A method of manufacturing a memory device, the method comprising:
forming a plurality of first conductive traces in a first dielectric layer of the memory device, wherein the first conductive traces extend in a first direction; and
forming a plurality of second conductive traces in a second dielectric layer located above the first dielectric layer, wherein the second conductive traces extend in a second direction orthogonal to the first direction, wherein:
the second conductive traces overlap with the first conductive traces in a region including
a plurality of slotted vias, and wherein:
each individual first conductive trace includes a first elongated segment oriented in a third direction rotated from the first direction by a first non-zero angle such that the third direction is different from the first and second directions;
each individual second conductive trace includes a second elongated segment oriented in the third direction such that the first elongated segment aligns and overlaps with the second elongated segment; and
each of the plurality of slotted vias has a primary axis oriented in the third direction such that it overlaps with a corresponding one of the first elongated segments.

\* \* \* \* \*